United States Patent
Chang et al.

(10) Patent No.: US 7,716,542 B2
(45) Date of Patent: May 11, 2010

(54) PROGRAMMABLE MEMORY BUILT-IN SELF-TEST CIRCUIT AND CLOCK SWITCHING CIRCUIT THEREOF

(75) Inventors: Yeong-Jar Chang, Hsinchu County (TW); Chung-Fu Lin, Taipei County (TW)

(73) Assignee: Faraday Technology Corp., Hsin-Chu (TW)

( * ) Notice: Subject to any disclaimer, the term of this patent is extended or adjusted under 35 U.S.C. 154(b) by 202 days.

(21) Appl. No.: 11/939,282

(22) Filed: Nov. 13, 2007

(65) Prior Publication Data
US 2009/0125763 A1    May 14, 2009

(51) Int. Cl.
*G01R 31/28* (2006.01)
*G11C 29/00* (2006.01)
*G06F 11/00* (2006.01)

(52) U.S. Cl. .................. 714/718; 714/733; 714/31; 714/35; 714/42; 365/201

(58) Field of Classification Search .................. None
See application file for complete search history.

(56) References Cited

U.S. PATENT DOCUMENTS 6,874,111 B1 *   3/2005   Adams et al. ............... 714/733
7,062,694 B2 *   6/2006   Caty et al. .................. 714/733
7,171,596 B2 *   1/2007   Boehler ...................... 714/718
2003/0048632 A1   3/2003   Archer ........................ 362/101
2006/0031726 A1   2/2006   Zappa et al.

FOREIGN PATENT DOCUMENTS

| DE | 299 04 988 | 8/1999 |
| DE | 102 01 131 | 8/2003 |
| DE | 10 2005 018 175 | 10/2006 |

OTHER PUBLICATIONS

Article titled "Programmable Memory Bist" authored by Boutobza et al., International Test Conference, 2005 IEEE. p. 1-p. 10.

\* cited by examiner

*Primary Examiner*—Christine T Tu
(74) *Attorney, Agent, or Firm*—Winston Hsu

(57) ABSTRACT

A programmable memory built-in self-test circuit and a clock switching circuit thereof are provided. The memory built-in self-test circuit is able to provide more self-test functions preset by a user, simplify the redundant circuit in the prior art and reduce chip area and lower the cost by means of an instruction decoder and a built-in self-test controller. The present invention also provides some peripheral control circuits of a memory. The control circuits occupies less area and enables the memory to be tested more flexibly. The present invention further provides a clock switching circuit enabling a chip to be correctly tested under different clock speeds, which benefits to advance the testability and the analyzability of the memory embedded in a chip and thereby increase fault coverage.

10 Claims, 4 Drawing Sheets

PROGRAMMABLE MEMORY BUILT-IN SELF-TEST CIRCUIT AND CLOCK SWITCHING CIRCUIT THEREOF

BACKGROUND OF THE INVENTION

1. Field of the Invention

The present invention relates to a built-in self-test circuit (BIST circuit), and more particularly, to a memory built-in self-test (MBIST) circuit and its address counter and clock switching circuit.

2. Description of Related Art

Along with the advance of semiconductor industry, the semiconductor process has stepped in very deep sub-micro (VDSM) technique level, where a more complicate and more precision chip design is required. Most products require embedded memories to handle complex and various operations, which accordingly needs tremendous test patterns for memory testing. Considering the above-mentioned need, in particular, the connection difficulty between a great lot of input/output ports of the memories and the external circuit out of the chip, a new technique, named as memory built-in self-test circuit, was provided. By using MBIST technique, a circuit purposely built in a memory chip is utilized to perform reading/writing tests in a specific duration on the internal memory circuits so as to judge the quality of the memory chip.

In a conventional MBIST circuit, several algorithms are usually supported, such as checkerboard algorithm, march C+ algorithm and march C− algorithm The checkerboard algorithm is to write alternately logic level values '1' and '0' into adjacent bits on the physical cell positions of a memory under test, followed by reading the hexadecimal values, for example 55 or AA etc. for testing. While with a march C+ algorithm or a march C− algorithm, the reading/writing tests are performed in an increasing transition order of addresses or a decreasing transition order of addresses on the memory bits repeatedly, until the predetermined test iterations are satisfied. A conventional MBIST is usually generated by electronic design automation (EDA) software, which has a fixed format and cannot be changed to suit the specific demand of user. For example, in the applications to test some application-specific integrated circuits (ASICs), the conventional MBIST is unable to provide an appropriate test pattern so as to lower the test fault coverage. Furthermore, when a user needs some specific test patterns for a diagnosis purpose, the EDA software fails to accomplish the goal as well. Although a MBIST able to accept a programming done by user is available today, but the area occupied by the above-mentioned built-in self-test circuit is still not compact sufficiently to satisfy the modern semiconductor industry for less circuit area and cheaper cost.

Additionally, in a conventional MBIST capable of supporting both schemes of generating memory addresses by column scanning and row scanning, two sets of counters are needed. FIG. 1 is a diagram of a conventional address counter, wherein the address counter includes a column scan counter 120, a row scan counter 110, an address register 130 and a multiplexer 140. The column scan counter 120 is used as an address counter during performing a column scan test, while the row scan counter 110 is used during performing a row scan test. When column scan is enabled (i.e., row scan is disabled), the multiplexer 140 selects a column scan address line 102 sent to the address register 130. In contrast, when row scan is enabled (i.e., column scan is disabled), the multiplexer 140 selects a row scan address line 101 sent to the address register 130. Once the memory under test has a large size, the corresponding bit number of address increases accordingly, which results in a large portion of the chip area occupied by the column scan counter 120 and the row scan counter 110. The production cost increases as well.

Another difficulty a conventional MBIST encounters rests in that the available clock frequency provided by a modern auto-testing equipment (ATE) is far lower than the clock frequency of a MBIST circuit, so that a clock hazard may occur during clock switching between a self-test mode and an external test mode with the ATE. The clock hazard may cause unexpected event during the subsequent test operations, which leads to faulty operation or no operation and increases the test difficulty.

SUMMARY OF THE INVENTION

Accordingly, the present invention is directed to a programmable memory built-in self-test circuit to meet the test requirements in various applications, advance the test quality in mass production, compact the circuit, reduce the chip area and support memory complier and built-in self-repair function (BISR function).

The present invention provides a memory built-in self-test circuit (MBIST circuit), which includes an instruction decoder and a built-in self-test controller (BIST controller). The instruction decoder is coupled with the BIST controller for receiving a control signal, while the BIST controller is for receiving the control signal. If the control signal is in a self-test mode, the instruction decoder decodes a self-test instruction, and the BIST controller tests the memory according to the decoded result of the self-test instruction. If the control signal is in an output mode, the instruction decoder suspends its operation, and the BIST controller outputs the test record of the memory. If the control signal is in a normal mode, the instruction decoder suspends its operation, and the BIST controller delivers the test signal of a functional circuit to the memory. In this way, a user is able to flexibly conducts switching between the normal mode and the self-test mode, observe the output status, easily conduct diagnosis and shorten time schedule to lunch a product on market.

The present invention provides a novel instruction set which is categorized into general instruction and repeatable instruction. The general instruction includes whether to support column scan, whether to perform diagnosis, counting up address or count down address, background data, inversion field and folded field, which are (b+5) bits in total (assuming the background data takes b bits). The repeatable instruction is required by every test and includes whether to end instructions, reading or writing and whether to invert, which are three bits in total. Once the march test element has n tests, the repeatable instruction would take 3n bits in total. The entire instruction set has (b+5+3n) bits. Assuming the march test element is denoted by (W0, R0, W1), three test operations, i.e. n=3, are required.

A conventional programmable MBIST circuit usually requires a scan register, an instruction register and a control register, wherein when a self-test instruction is output from a test machine to a chip-under-test (CUT), the instruction is received by the scan register, and then sent to the instruction register for storage. Thereafter, the instruction is sent out for circuit operations, following by sending appropriate operation results, such as data, address, memory enabling (CE) and reading/writing enabling (WE), to the control register for controlling the operations of the memory. The present invention further provides register sharing capability. With the register sharing capability, as long as the control signal of the memory can be generated directly by the instruction register, the instruction register is competent to accomplish the above-mentioned three tasks, which facilitates reducing the chip area.

The present invention provides an address counter, which includes a address register, a rising-transition scrambler, a row scan adder and a falling-transition scrambler, wherein the address register is for storing and providing the access address of a memory, the rising-transition scrambler is coupled with the address register and receives the access address from the address register, the row scan adder is coupled with the rising-transition scrambler for adding a binary '1' to the address output from the rising-transition scrambler and then outputting the above-mentioned address, and the falling-transition scrambler is coupled with the row scan adder for receiving the address output from the row scan adder. If a memory has $2^n$ addresses in total and each column has $2^r$ addresses, the address of the memory has n bits and r folded bits, wherein n and r are preset integers. Based on the design principle of the present invention, if it is a row scan, the value of the address register is directly sent to the row scan adder, after adding a binary '1' thereto, an updated address is obtained, that is, an operation of moving the address of a row scan is accomplished. If it is a column scan, the rising-transition scrambler moves the lower r bits to the highest bit position, right-shifts the higher (n-r) bits by r bits and then sends the address to the row scan adder for adding '1' thereto. Thereafter, the falling-transition scrambler moves the higher r bits to the lowest bit position, left-shifts the lower (n-r) bits by r bits so as to generate an updated address. In this way, an operation of moving the address of a column scan is accomplished.

The present invention provides a clock switching circuit, wherein two enabling signals are used to control two clock signals, and negative edge-triggered delay flip-flops are used to control the enabling signals to avoid unexpected '0' or '1' clock hazard. The approach is able to directly conduct a design of register transfer level (RTL). Once paying attention that one of the above-mentioned clock enabling signals is turned off firstly, following by turning on another clock enabling signal, the synthesis and the placing and routing transistors are very easily conducted where there is no worry about any timing problem caused by a process drift or a logic operation speed; as a result, the clock switching is very stable.

Since the present invention adopts a lot of novel ideas to compact the chip area of a programmable MBIST circuit, a lower production cost is achieved. The present invention supports more functions with more flexibilities of self-testing a memory. In addition, the present invention also provides a peripheral control circuit for increasing the test fault coverage with a less chip area. In particular, the clock switching circuit of the present invention enables correct switching of the test clock between the MBIST circuit and the external test machine, which makes the memory test and diagnosis more flexible.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
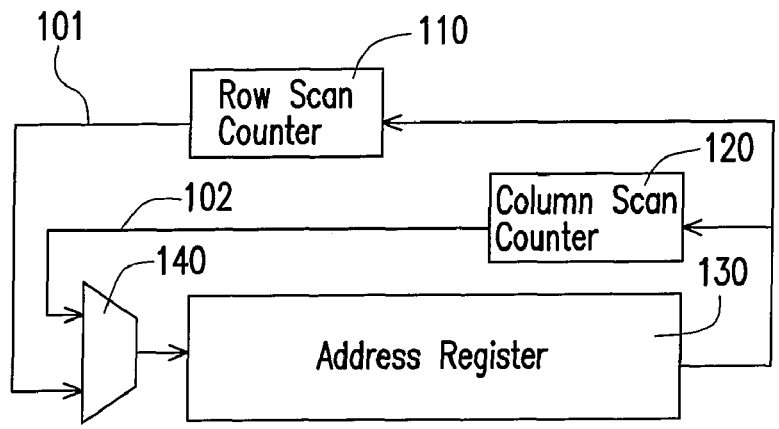
FIG. 1 is a diagram of a conventional address counter.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
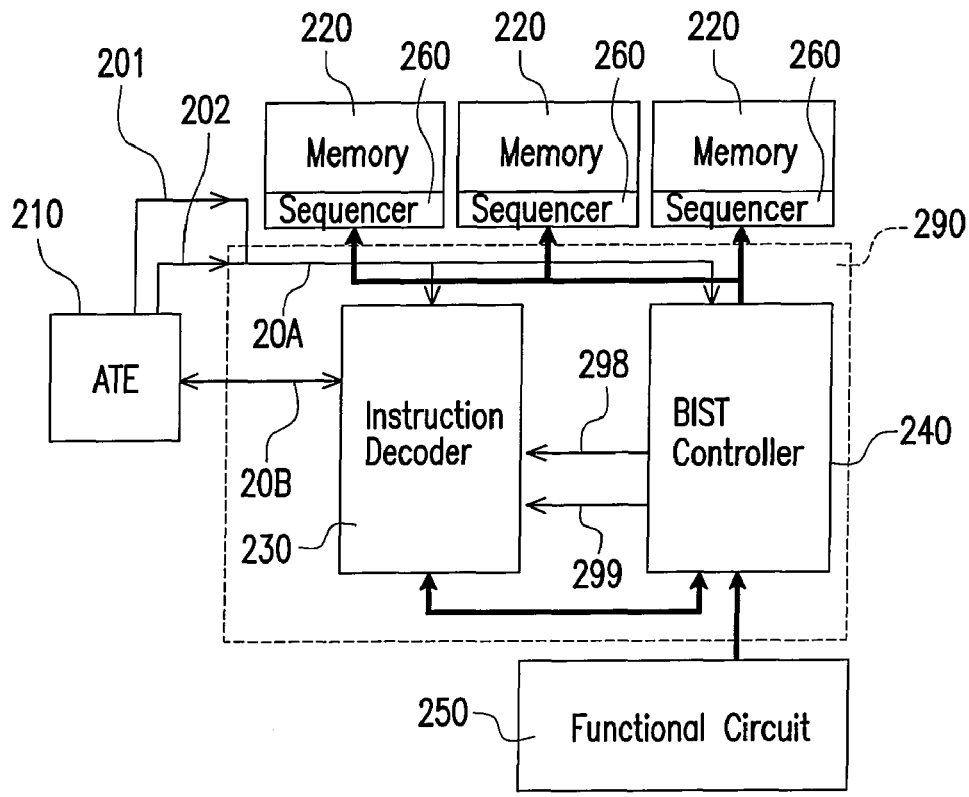
FIG. 2A is a memory built-in self-test circuit (MBIST circuit) according to an embodiment of the present invention.

FIG. 2A is a memory built-in self-test circuit (MBIST circuit) according to an embodiment of the present invention, wherein an MBIST circuit 290, a plurality of memories under test (MUTs) 220, a plurality of sequencers 260 each of the MUTs 220 respectively belongs to, an auto-testing equipment (ATE) 210 connected to outside and a functional circuit 250 are illustrated. Each of the MUTs 220 and the corresponding sequencer 260 are respectively coupled with the MBIST circuit 290, the MBIST circuit 290 is coupled with the ATE 210 and the functional circuit 250 is coupled with the MBIST circuit 290.

Referring to FIG. 2A, the MBIST circuit 290 includes an instruction decoder 230 and a BIST controller 240 both are interconnected to each other. The BIST controller 240 and the instruction decoder 230 receive a control signal 20A, wherein the control signal 20A is composed of a first signal 201 and a second signal 202 both output from the ATE 210. When the first signal 201 takes logic level 0, the operation is in the self-test mode regardless of the value of the second signal 202. In this case, the instruction decoder 230 decodes the self-test instruction sent from the ATE 210, while the BIST controller 240 tests the memory 220 according to the decoded self-test instruction. When the first signal 201 takes logic level 1 and the second signal 202 also takes logic level 1, the operation is in the output mode. In this case, the instruction decoder 230 suspends its operation and the BIST controller 240 outputs an instant status and result of self-testing the memory 220 to the ATE 210. When the first signal 201 takes logic level 1 and the second signal 202 takes logic level 0, the operation is in the normal mode. In this case, the normal operations between the functional circuit 250 and the memory 220 keep going, that is, the functional circuit 250 directly controls reading/writing operations on the memory 220. The normal mode is helpful for engineer to detect the memory 220 and able to provide the testing in normal mode and self-test mode with an alternate manner to enhance the testing flexibility. The relationship between the control signal 20A and the operation modes are shown by Table 1.

TABLE 1

Relationship between the Control Signal 20A and the Operation Modes

| First Signal 201 | Second Signal 202 | Operation Mode |
| --- | --- | --- |
| 0 | X | self-test mode |
| 1 | 1 | output mode |
| 1 | 0 | normal mode |

Figure 2B:
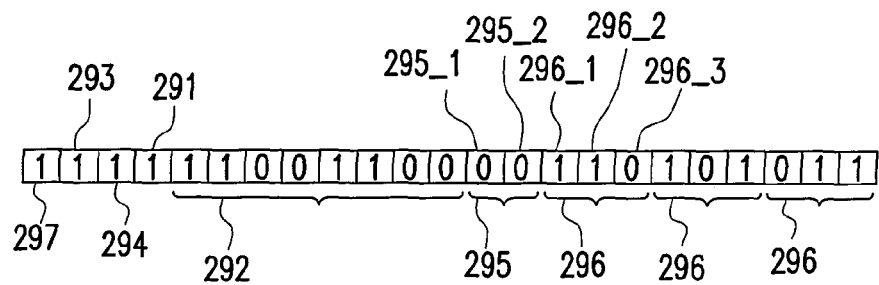
FIG. 2B is a diagram showing a self-test instruction according to an embodiment of the present invention.

FIG. 2B is a diagram showing self-test instructions 200 according to an embodiment of the present invention. The self-test instruction 200 includes a direction field 291 in 1-bit, a data background field 292 in 8-bits, a column scan field 293 in 1-bit, a diagnosis field 294 in 1-bit, a data background variation field 295 in 2-bits, a plurality of march set fields 296 in 3-bits and a port selection field 297 in 1-bit. The direction field 291 indicates an increasing transition order or a decreasing transition order of access address during self-testing the memory. The data background field 292 is for storing data background for testing and the bit number thereof depends on the quantity of the memory cell arrays of the memory; for example, a 1024×8 memory has 1024 addresses, each of the addresses can be stored by 8-bits data, thus, the corresponding data background field 292 in the embodiment has 8-bits. The column scan field 293 indicates a column scan or a row scan is used to conduct testing memory. Correspondingly to a row scan, the address of the memory increases/decreases by one each times; while correspondingly to a column scan, the address of the memory increases/decreases by a number equal to the address number of each row, for example, the 1024 addresses of the memory are composed of 256 rows with 4 addresses each row, then, correspondingly to a column scan, the address increases or decreases by four.

The diagnosis field 294 is for indicating whether to output the instant status and test result record of self-test when an abnormal testing is found. The data background variation field 295 indicates along row direction or along column direction the data background 292 varies and the data background variation field 295 is composed of an inversion field 295_2 and a folded field 295_1. Table 2 lists the relationship between the data background 292, the inversion field 295_2, the folded field 295_1 and the test pattern.

TABLE 2

Relationship between Data Background 292, Inversion field 295_2, Folded field 295_1 and Test Pattern

| Data Background 292 | Inversion field 295_2 | Folded field 295_1 | Test Pattern |
|---|---|---|---|
| 0 | 0 | 0 | 0000 |
|   |   |   | 0000 |
|   |   |   | 0000 |
|   |   |   | 0000 |
| 0 | 0 | 1 | 0000 |
|   |   |   | 1111 |
|   |   |   | 0000 |
|   |   |   | 1111 |
| 0 | 1 | 0 | 0101 |
|   |   |   | 0101 |
|   |   |   | 0101 |
|   |   |   | 0101 |
| 0 | 1 | 1 | 0101 |
|   |   |   | 1010 |
|   |   |   | 0101 |
|   |   |   | 1010 |
| 1 | 0 | 0 | 1111 |
|   |   |   | 1111 |
|   |   |   | 1111 |
|   |   |   | 1111 |
| 1 | 0 | 1 | 1111 |
|   |   |   | 0000 |
|   |   |   | 1111 |
|   |   |   | 0000 |
| 1 | 1 | 0 | 1010 |
|   |   |   | 1010 |
|   |   |   | 1010 |
|   |   |   | 1010 |
| 1 | 1 | 1 | 1010 |
|   |   |   | 0101 |
|   |   |   | 1010 |
|   |   |   | 0101 |

As shown by Table 2, when the inversion field 295_2 is set to be logic level 1, the test pattern takes the data background as initial value and a '0/1' bit inverting operation along the row direction is performed. When the folded field 295_1 is set to be logic level 1, the test pattern still takes the data background as initial value, but a '0/1' bit inverting operation along the column direction is performed. In this way, a less number of fields allows the data background of built-in self-testing to have more variations of combination.

Continuing to FIG. 2B, the march set fields 296 include three fields, an end-of-command (EOC) field 296_1, a reading/writing field 296_2 and a data field 296_3. The EOC field 296_1 indicates whether the march set fields are the final one 296. The reading/writing field 296_2 indicates 'reading from' or 'writing into' the test operation of the memory 220 during the time is. The data field 296_3 indicates the data to be written into the memory 220 or the expected data to be read out from the memory 220. Each march set field 296 means a reading/writing operation of the self-test instruction. In comparison with the prior art where a counter is used to calculate the operation number of reading/writing to thereby assure the reading/writing operations have been completed, in the present invention, only one bit is used to implement the EOC field 296_1, therefore, the required judging circuit in the present invention is much simpler than the counter and the comparison circuit in the prior art, which is helpful to save chip area.

The port selection field 297 is used to test a multi-port memory to indicate which port of a memory is used for testing, wherein the bit number thereof depends on the port quantity of the memory under test 220.

Referring to FIG. 2B again, the values of all the fields of the self-test instruction 200 and the meanings corresponding to the values are depicted as follows. The port selection field 297 is set to be 1, which means the port '1' of the memory is selected to execute built-in self-testing; the direction field 291 is set to be 1, which means the address of the memory is increasing; the column scan field 293 is set to be 1, which means to enable column scan; the diagnosis field 294 is set to be 1, which means once a test fault occurs, the instant testing data is sent out. The data background field 292 is set to be 11001100, which means both the folded field 295_1 and the bit-sign inversion field 295_2 in the data background variation field 295 are cleared to be zero and the background data are neither aliased nor inverted. In the first march set field in 3-bits 296, three bits are sequentially 110, which means the EOC field 296_1 and the reading/writing field 296_2 are respectively 1, and the data field 296_3 is cleared to be 0, wherein the first 1 represents the command is not ended, the second 1 represents another succeeding march set field is coming and the last 0 means the data read out from the memory should be 0. Similarly, the second march set field 296 is 101, which means the command is not ended and the data read out from the memory should be 0; the third march set field 296 is 011, which mans the command is over, the data read out from the memory should be 1 and no more other march set field is coming.

After each self-test instruction is completed, the BIST controller 240 would transmit a completing signal 298 and a testing result signal 299 to the instruction decoder 230, wherein the completing signal 298 is for notifying the instruction decoder 230 of continuously sending out next self-test instruction and the testing result signal 299 is for notifying the instruction decoder 230 of whether a testing fault occurs.

Figure 3:
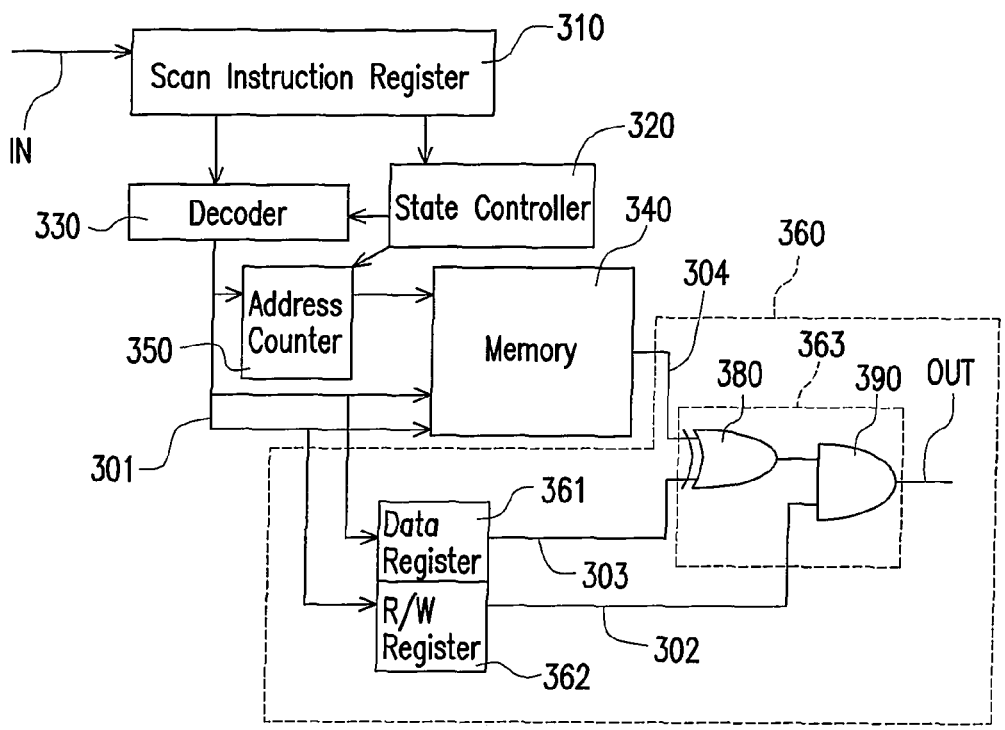
FIG. 3 is a diagram of an MBIST circuit for testing a single memory according to an embodiment of the present invention.

FIG. 3 is a diagram of an MBIST circuit for testing a single memory according to an embodiment of the present invention. The embodiment in FIG. 3 is corresponding to the embodiment of FIG. 2A, wherein the instruction decoder 230 includes a scan instruction register 310 and a decoder 330. The BIST controller 240 herein includes a state controller 320, an address counter 350 and a comparison circuit 360. The scan instruction register 310 herein is for receiving and storing the self-test instruction. The decoder 330 is coupled with the scan instruction register 310 to decode the self-test instruction. The state controller 320 is coupled with the scan instruction register 310 and the decoder 330 for controlling the memory 340 according to the self-test instruction. The comparison circuit 360 is coupled with the decoder 330 to compare the data field of the self-test instruction with the output data of the memory 340 and provide a fault signal OUT according to the comparison result, wherein the comparison circuit 360 includes a data register 361, a reading/writing register 362 and a logic circuit 363. The data register 361 is coupled with the decoder 330 for storing the expected output data is sourced from the data field of the self-test instruction and provided by the decoder 330. The reading/writing register 362 is coupled with the decoder 330 for receiving the content of the reading/writing field of the self-test instruction from the decoder 330 and storing the content. The logic circuit 363 is coupled with the decoder 330, the data register 361 and the reading/writing register 362 for comparing the actual output data of the memory 340 with the expected output data stored in the data register 361. If the actual output data is not the same as the expected output data and the reading/writing field stored in the reading/writing register 362 indicates a reading operation, the fault signal OUT is enabled by taking 1, which indicates a built-in self-testing fault occurs.

As described in the 'Summary of the Invention', a conventional programmable MBIST circuit includes three sets of registers. The present invention provides a novel architecture which combines the three sets of registers into one. As shown by FIG. 3, the scan instruction register 310 in the embodiment receives a self-test instruction via an input terminal IN, stores the self-test instruction and then sends the stored self-test instruction to the decoder 330 for decoding. The address counter 350 sets the access address for the memory under test 340 according to the decoding result of an input bus 301, following by conducting reading/writing test on the memory 340. The value read out from the memory 340 is sent to the logic circuit 363 through an output bus 304. When the memory is under a reading test, since the reading/writing field in the self-test instruction is set as 1, the reading/writing register 362 outputs a logic level 1. At the time, if the output data come from the memory 340 is not equal to the data field content stored in the data register 361, an exclusive-or (XOR) gate 380 would outputs logic level 1, so that the fault signal OUT output from an AND gate 390 takes logic level 1 as well (enabling) to indicate a memory test failure.

In addition, in comparison with the prior art where data is read out from a memory and then passes through a long operation path, so that a longer operation time and a longer clock cycle are needed, the present invention employs a register within the operation path to shorten the required operation time for each cycle, which is equivalent to a pipeline design pattern and makes the test quicker than the prior art by 1.8 times. Continuing to FIG. 3, the data field of the self-test instruction is stored in the data register 361, while the reading/writing field of the self-test instruction is stored in the reading/writing register 362. The logic circuit 363 includes an XOR gate 380 and an AND gate 390, wherein the XOR gate 380 receives the outputs from the data register 361 and the memory 340, the output terminal of the XOR gate 380 is coupled with an input terminal of the AND gate 390, while another terminal of the AND gate 390 is coupled with the reading/writing register 362 and the AND gate 390 outputs a fault signal OUT.

Figure 4:
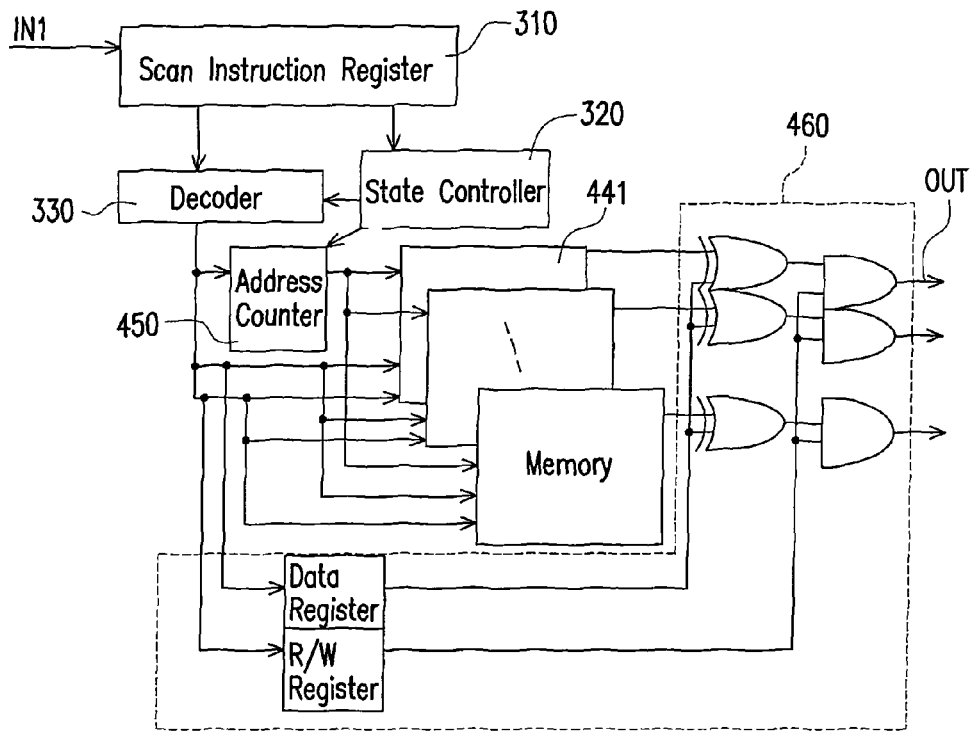
FIG. 4 is a diagram of an MBIST circuit for testing multiple memories according to an embodiment of the present invention.

FIG. 4 is a diagram of an MBIST circuit for testing multiple memories according to an embodiment of the present invention, wherein the MBIST circuit includes a set of a scan instruction registers 310, a state controller 320 and a decoder 330, wherein the set is available for sharing by a plurality of memories 441. In addition, the MBIST circuit includes a plurality of address counters 450 and a plurality of comparison circuits 460, wherein each address counter 450 is coupled with the decoder 330 and the state controller 320 to provide access addresses for conducting one of tests on the memories 441, each comparison circuit 460 is coupled with the decoder 330 to compare the data field of the self-test instruction with one of the output data from the memories 441 and provide a fault signal OUT according to the above-mentioned comparison result.

FIG. 4 is a diagram of an MBIST circuit for testing multiple memories according to an embodiment of the present invention, wherein the operation is similar to the MBIST circuit for a single memory in the above-described embodiment, but the single memory under test is evolved to multiple memories under test; thus, the details are omitted to describe herein. Since the scan instruction register 310, the state controller 320 and the decoder 330 in the BIST circuit of the embodiment can be shared, the chip area of the BIST circuit for multiple memories and the production cost are further effectively reduced.

Figure 5:
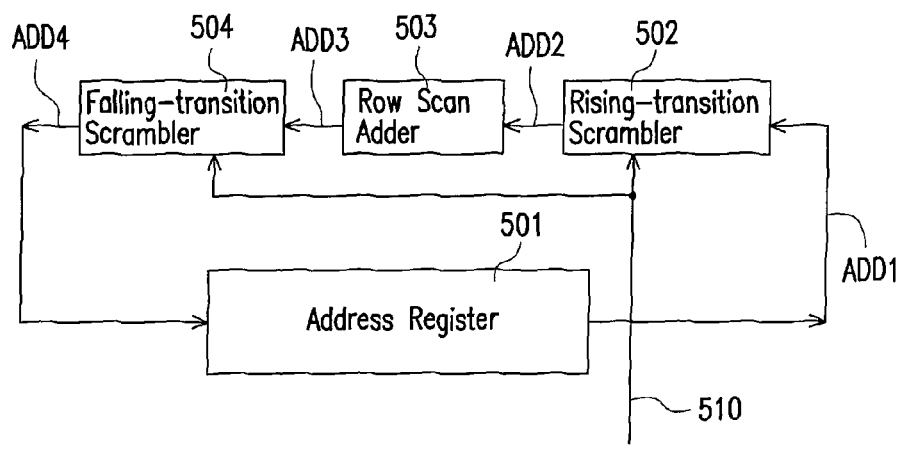
FIG. 5 is a diagram of an address counter according to an embodiment of the present invention.

FIG. 5 is a diagram of an address counter according to an embodiment of the present invention, wherein the address counter includes an address register 501, a rising-transition scrambler 502, a falling-transition scrambler 504 and a row scan adder 503. The address register 501, the rising-transition scrambler 502, the row scan adder 503 and the falling-transition scrambler 504 are coupled with each other in ring series connection, and the rising-transition scrambler 502 and the falling-transition scrambler 504 are together coupled with a column scan selection signal 510. The rising-transition scrambler 502 receives an initial memory access address ADD1 come from the address register 501. Assuming the access address ADD1 has n-bits and r folded bits, wherein n and r are preset integers, during a column scan (the column scan selection signal 510 is enabled), the rising-transition scrambler 502 moves the lower r bits of the access address ADD1 to the highest bit position, right-shifts the higher (n-r) bits of the access address ADD1 by r bits and then outputs the result as a second address data ADD2. For example, if n=6, r=3 and the initial memory access address ADD1 is 101000, then, the second address data ADD2 is 000101.

The row scan adder 503 receives the second address data ADD2 for adding '1' thereto to become a third address data ADD3 for outputting. In the above-mentioned example, the third address data ADD3 is 000110.

The falling-transition scrambler 504 receives the third address data ADD3 and during a column scan (the column scan selection signal 510 is enabled) the falling-transition scrambler 504 moves the higher r bits of the third address data ADD3 to the lowest bit position, left-shifts the lower (n-r) bits of the third address data ADD3 by r bits and then outputs the modified address as a fourth address data ADD4, and in the above-mentioned example, the fourth address data ADD4 would be 110000. The newly generated fourth address data ADD4 is sent to the address register 501 as an updated memory access address. In the same way, the access address provided by the address register 501 is counted as follows: 110_000→111_000→000_001→001_001→010_001→011_001→ . . . , until all column scans are completed.

During a row scan (the column scan selection signal 510 is disabled), the rising-transition scrambler 502 and the falling-transition scrambler 504 do not move the bits but directly output the inputs. Meanwhile, the row scan adder 503 mechanically adds one to the memory access address each times, and the access address ADD1 is counted as follows: 110_000→110_001→110_010→110_011→110_100→110_101→ . . . , until all row scans are completed. It can be seen from the above described, the present invention employs a set of counters only to accomplish the function of counting the memory access address for column scans and row scans, which is more saved in comparison with the prior art where two sets of counters are required.

Figure 6A:
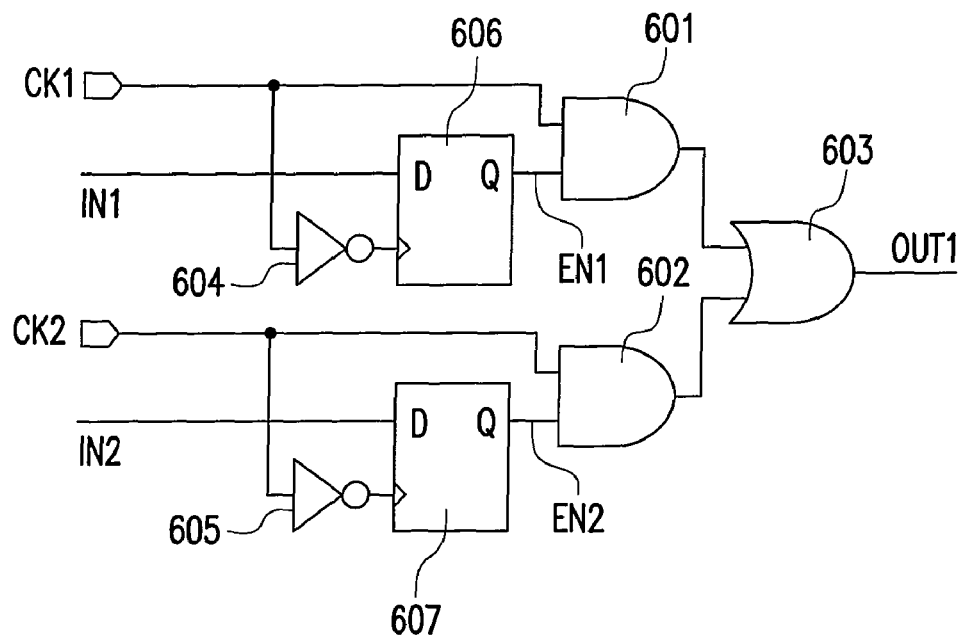
FIG. 6A is a diagram of a clock switching circuit according to an embodiment of the present invention.

FIG. 6A is a diagram of a clock switching circuit according to an embodiment of the present invention. The clock switching circuit includes a first inverter 604, a first delay flip-flop 606, a first AND gate 601, a second inverter 605, a second delay flip-flop 607, a second AND gate 602 and an OR gate 603, wherein the first inverter 604 receives a first clock signal CK1, the first delay flip-flop 606 is coupled with the first inverter 604 to receive a first enabling signal IN1 and uses the output of the first inverter 604 as a triggering signal, the first AND gate 601 is coupled with the first delay flip-flop 606 to receive the first clock signal CK1 and the output of the first delay flip-flop 606. On the other hand, the second inverter 605 receives a second clock signal CK2, the second delay flip-flop 607 is coupled with the second inverter 605 to receive a second enabling signal IN2 and uses the output of the second inverter 605 as a triggering signal. The second AND gate 602 is coupled with the second delay flip-flop 607 to receive the second clock signal CK2 and the output of the second delay flip-flop 607. The OR gate 603 is coupled with the first AND gate 601 and the second AND gate 602 to receive the outputs of the first AND gate 601 and the second AND gate 602 and provide the output thereof as an operation clock signal of the instruction decoder and the BIST controller in the BIST circuit.

Figure 6B:
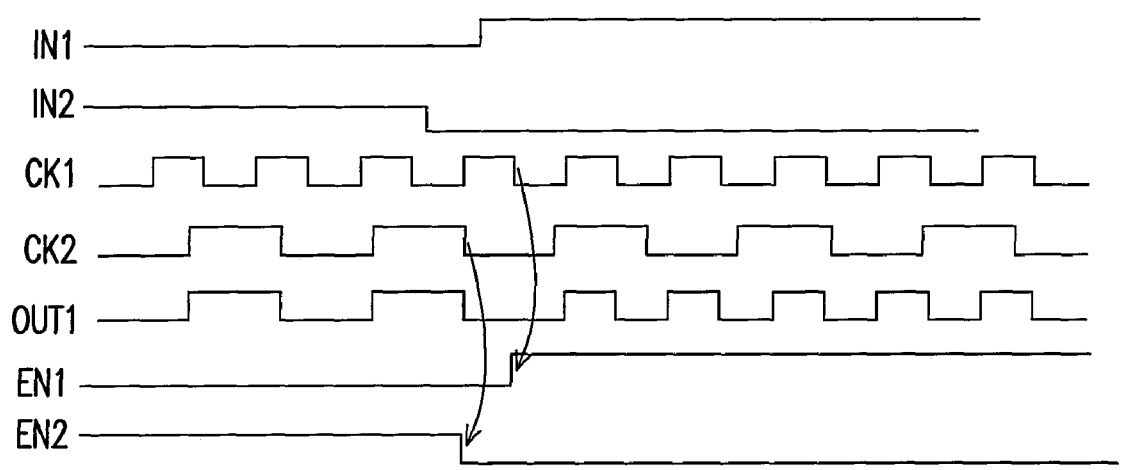
FIG. 6B is a signal waveform diagram of a clock switching circuit according to an embodiment of the present invention.

To assure the clock switching circuit for correctly operations without a clock hazard, the first enabling signal IN1 must be enabled after the second enabling signal IN is disabled and the second enabling signal IN2 must be enabled after the first enabling signal IN1 is disabled. FIG. 6B is a signal waveform diagram of a clock switching circuit according to an embodiment of the present invention. Referring to FIG. 6B, a clock enabling signal EN2 changes the status thereof from enabling to disabling (1 changed to 0) only after another clock enabling signal EN1 takes 0 and at CK2 takes a negative edge; EN1 changes the status thereof from disabling to enabling (0 changed to 1) only after EN2 takes 0 and at CK1 takes a negative edge, and vice versa. The clock enabling signals (EN1 and EN2) do not simultaneously take 1 by means of a proper logic control of IN1 and IN2. The above-mentioned clock switching circuit enables the MBIST circuit of the present invention to switch between two clock signals at different speeds without causing a clock hazard during the switching. In this way, two types of memory tests conducted by an external auto-testing equipment and the MBIST circuit of the present invention can alternately run, which greatly benefit the engineering diagnosis and increasing the fault coverage in mass production tests.

In summary, the present invention provides a MBIST circuit, which provides more-flexible programmable test instructions, compacts the circuit area, and shortens the time required for reading a memory and comparing the memory data during a self test. The present invention further provides an effective clock switching circuit so as to make testing an embedded memory under different clock frequencies possible, thereby increasing the fault coverage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory built-in self-test circuit, comprising:
an instruction decoder for receiving a control signal; and
a built-in self-test controller, coupled with the instruction decoder for receiving the control signal; wherein
if the control signal is in a self-test mode, the instruction decoder decodes a self-test instruction sent from an auto-testing equipment and the built-in self-test controller tests a memory according to the decoded result of the self-test instruction;
if the control signal is in an output mode, the instruction decoder suspends its operation and the built-in self-test controller outputs the testing record of the memory;
if the control signal is in a normal mode, the instruction decoder suspends its operation and the built-in self-test controller delivers a testing signal generated by an external functional circuit to the memory, wherein the functional circuit controls a reading operation or a writing operation of the memory with the testing signal.

2. The memory built-in self test circuit according to claim 1, wherein the self-test instruction comprises:
a direction field for indicating whether increasing or decreasing the access address for testing the memory is;
a data background field for indicating a data background used in testing the memory; the data background field comprising a plurality of bits and each of the bits is corresponding to one of a plurality of memory cell arrays of the memory;
a march set field for indicating whether 'reading from' or 'writing into' the testing operation on the memory is, the march set field further indicating the data to be written into the memory and the expected data output from the memory;
a port selection field for indicating via which port of the memory to test the memory;
a column scan field for indicating whether a row scan manner or a column scan manner is taken to test the memory; and
a diagnosis field for indicating whether the built-in self-test controller outputs an instant testing record when a testing failure of the memory occurs.

3. The memory built-in self test circuit according to claim 2, wherein the self test instruction further comprises:

an inversion field for indicating whether a 0/1 inverting on the data background is conducted along the row direction.

4. The memory built-in self test circuit according to claim 2, wherein the self test instruction further comprises:
a folded field for indicating whether a 0/1 inverting on the data background is conducted along the column direction.

5. The memory built-in self test circuit according to claim 2, wherein the march set field comprises:
an end-of-command (EOC) field for indicating whether another march set field is after the march set field;
a reading/writing field for indicating whether 'reading from' or 'writing into' the testing operation on the memory is; and
a data field for indicating the data to be written into the memory or the expected data output from the memory.

6. The memory built-in self-test circuit according to claim 1, wherein the instruction decoder comprises:
a scan instruction register for receiving and storing the self-test instruction and generating a signal to control the memory according to the self-test instruction; and
a decoder, coupled with the scan instruction register for decoding the self-test instruction;
and the built-in self-test controller comprises:
a state controller, coupled with the scan instruction register and the decoder for controlling the state change of the testing course of the memory according to the self-test instruction, wherein the state change comprises the change of the access address and the change of the data background during the testing course;
an address counter, coupled with the decoder and the state controller for providing the access address of the testing course according to the decoded result of the self-test instruction and the indication of the state controller;
a data register, coupled with the decoder for storing the expected output data of the memory;
a reading/writing register, coupled with the decoder for storing a reading/writing field of the self-test instruction; and
a logic circuit, coupled with the data register and the reading/writing register for comparing the output data from the memory and the expected output data of the memory, wherein if the output data is not equal to the expected output data and the indication of the reading/writing field is 'reading from', a fault signal is enabled.

7. The memory built-in self-test circuit according to claim 6, wherein the address counter comprises:
an address register for storing and providing the access address of the testing course of the memory;
a rising-transition scrambler, coupled with the address register for receiving the access address from the address register;
a row scan adder, coupled with the rising-transition scrambler for adding 1 to the address output from the rising-transition scrambler and outputting the updated address; and
a falling-transition scrambler, coupled with the row scan adder for receiving the output address of the row scan adder; wherein
the access address has n bits and r folded bits, wherein n and r are preset integers;
during a row scan, the rising-transition scrambler directly outputs the access address and the falling-transition scrambler directly outputs the output address of the row scan adder;
during a column scan, the rising-transition scrambler moves the lower r bits of the access address to the highest position and right-shifts the higher (n-r) bits of the access address by r bits and outputs the updated access address, while the falling-transition scrambler moves the higher r bits of the output address of the row scan adder to the lowest position and left-shifts the lower (n-r) bits of the output address of the row scan adder by r bits and outputs the updated output address.

8. The memory built-in self test circuit according to claim 6, wherein the built-in self-test controller is for testing multiple memories, the state controller controls the state change of the testing course of the memories according to the self-test instruction, and the built-in self-test controller comprises:
a plurality of address counters, wherein each of the address counters is coupled with the decoder and the state controller for providing the access address of the testing course of one of the memories according to the decoded result of the self test instruction and the indication of the state controller; and
a plurality of comparison circuits, wherein each of the comparison circuits is coupled with the decoder for comparing a data field of the self test instruction with the output data of one of the memories and for providing a fault signal according to the above-mentioned comparison result.

9. The memory built-in self-test circuit according to claim 1, further comprising a clock switching circuit for providing one of two clock signals as an operation clock signal, the clock switching circuit is characterized by using two enabling signals simultaneously to control the above-mentioned two clock signals and using two negative edge-triggered delay flip-flops to control the above-mentioned two enabling signals, wherein prior to enabling any one of the above-mentioned two enabling signals, the other one of the above-mentioned two enabling signals must be disabled.

10. The memory built-in self-test circuit according to claim 9, wherein the clock switching circuit comprises:
a first inverter for receiving a first clock signal;
a first delay flip-flop, coupled with the first inverter for receiving a first enabling signal and using the output of the first inverter as a triggering signal;
a first AND gate, coupled with the first delay flip-flop for receiving the first clock signal and the output of the first delay flip-flop;
a second inverter for receiving a second clock signal;
a second delay flip-flop, coupled with the second inverter for receiving a second enabling signal and using the output of the second inverter as a triggering signal;
a second AND gate, coupled with the second delay flip-flop for receiving the second clock signal and the output of the second delay flip-flop; and
an OR gate, coupled with the first AND gate and the second AND gate for receiving the outputs of the first AND gate and the second AND gate and providing the operation clock signal.

* * * * *